United States Patent [19]
Akram et al.

[11] Patent Number: 5,849,635
[45] Date of Patent: Dec. 15, 1998

[54] SEMICONDUCTOR PROCESSING METHOD OF FORMING AN INSULATING DIELECTRIC LAYER AND A CONTACT OPENING THEREIN

[75] Inventors: Salman Akram; Tyler A. Lowrey, both of Boise, Id.

[73] Assignee: Micron Technology, Inc., Boise, Id.

[21] Appl. No.: 680,790

[22] Filed: Jul. 11, 1996

[51] Int. Cl.⁶ .............................. H01L 21/44; B05D 1/36
[52] U.S. Cl. .......................... 438/704; 438/703; 438/705; 438/706; 438/738; 438/743; 438/745; 438/756; 438/763; 438/783; 438/784; 438/787; 438/790; 216/62; 216/87; 427/419.2; 427/419.7
[58] Field of Search .................................. 216/39, 57, 62, 216/87, 99, 109; 427/419.2, 419.7; 438/233, 666, 668, 703, 704, 705, 706, 738, 743, 745, 749, 751, 756, 763, 783, 784, 787, 911, 935, 790

[56] References Cited

U.S. PATENT DOCUMENTS

| Re. 33,622 | 6/1991 | Lee et al. | 438/400 |
|---|---|---|---|
| 4,372,034 | 2/1983 | Bohr | 438/624 |
| 4,484,978 | 11/1984 | Keyser | 216/47 |
| 4,902,377 | 2/1990 | Berglund et al. | 438/640 |
| 5,132,774 | 7/1992 | Matsuura et al. | 257/758 |
| 5,180,689 | 1/1993 | Liu et al. | 438/640 |
| 5,246,883 | 9/1993 | Lin et al. | 438/640 |
| 5,250,468 | 10/1993 | Matsuura et al. | 438/790 |
| 5,356,722 | 10/1994 | Nguyen et al. | 427/569 |
| 5,424,253 | 6/1995 | Usami et al. | 438/762 |
| 5,459,353 | 10/1995 | Kanazawa | 257/751 |
| 5,502,006 | 3/1996 | Kasagi | 438/624 |
| 5,712,194 | 1/1998 | Kanazawa | 438/618 |

*Primary Examiner*—Bernard Codd
*Attorney, Agent, or Firm*—Wells, St. John, Roberts Gregory & Matkin P.S.

[57] ABSTRACT

A semiconductor processing method of forming a contact opening includes providing a substrate having a node location to which electrical connection is to be made. A layer comprising doped silicon dioxide is formed over the node location. Thereafter, both $O_2$ and $O_3$ are flowed simultaneously to the substrate along with tetraethylorthosilicate to the substrate to form a continuous layer comprising undoped silicon dioxide on the layer comprising doped silicon dioxide. During the flowing, a ratio of $O_3$ to $O_2$ flows is increased to form an outer portion of the continuous layer comprising undoped silicon dioxide to have a higher etch rate for a selected wet etch chemistry than an inner portion of said continuous layer. A common contact opening is anisotropically dry etched into the layer comprising undoped silicon dioxide and into the layer comprising doped silicon dioxide over the node location to outwardly expose the node location. After this etching, a subsequent wet etching with the selected chemistry is conducted within the common contact opening to widen the contact opening in the outer portion of the layer comprising undoped silicon dioxide as compared to the inner portion of the layer comprising undoped silicon dioxide. The subsequent wet etching is chosen and conducted to be effectively selective to not substantially laterally etch the layer comprising doped silicon dioxide.

1 Claim, 4 Drawing Sheets

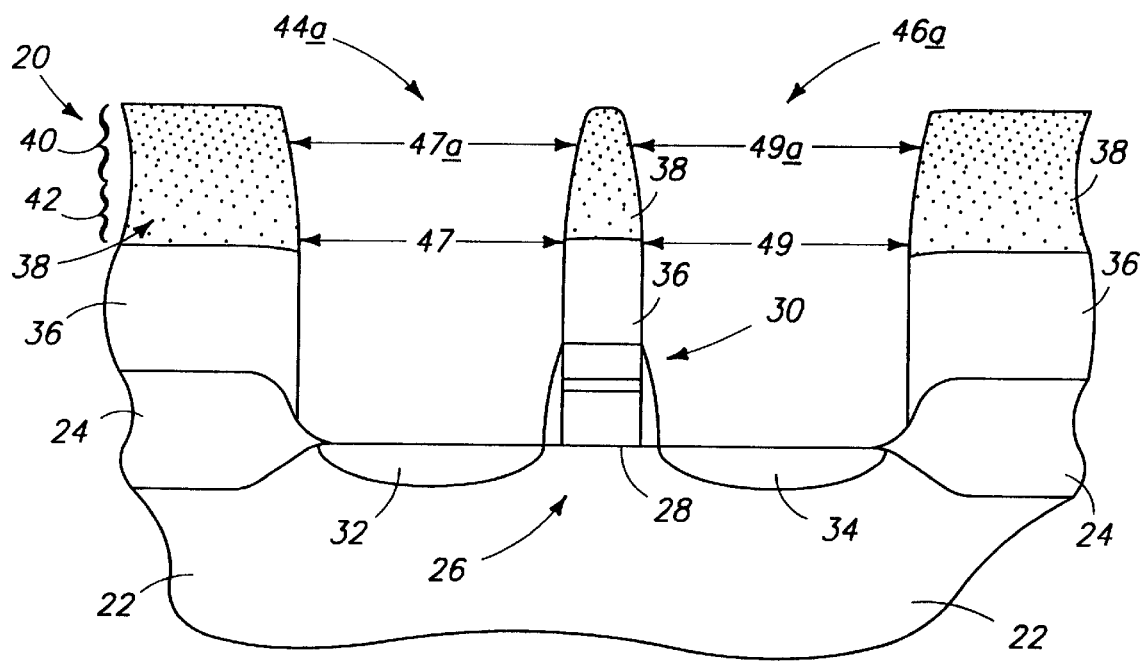
_Fig 5_
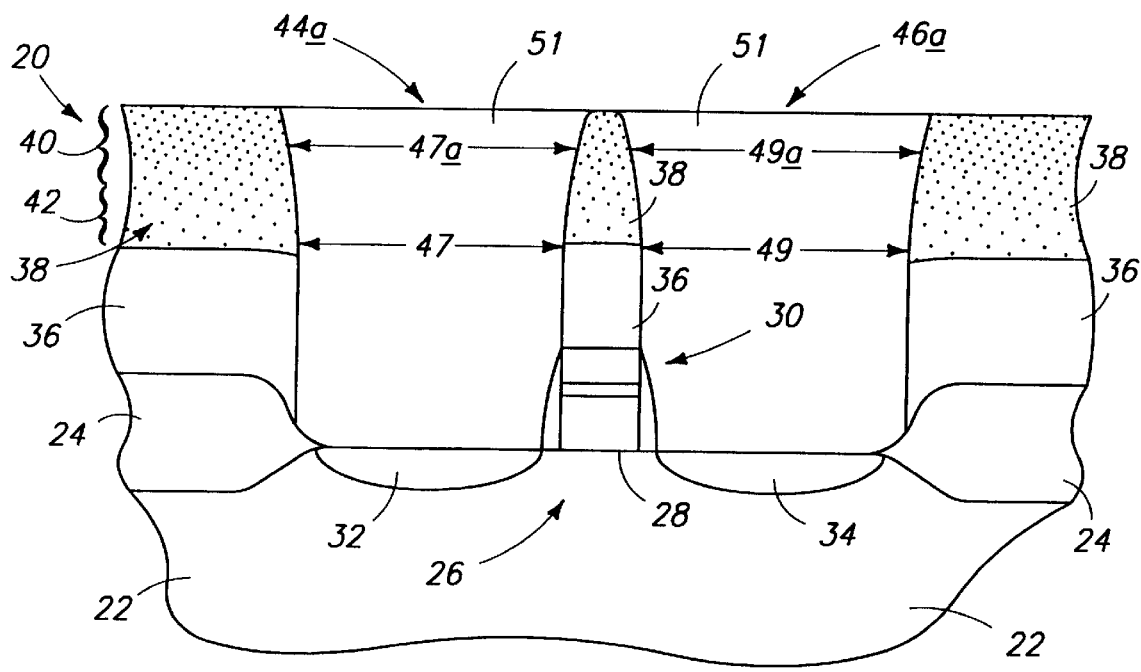
_Fig 6_

SEMICONDUCTOR PROCESSING METHOD OF FORMING AN INSULATING DIELECTRIC LAYER AND A CONTACT OPENING THEREIN

TECHNICAL FIELD

This invention relates to semiconductor processing methods of forming an insulating dielectric layer and a contact opening therein.

BACKGROUND OF THE INVENTION

The invention primarily grew out of needs for making highly reliable, high density dynamic random access memory (DRAM) contacts. Advance semiconductor fabrication is employing increasing vertical circuit integration as designers continue to strive for circuit density maximization. Such typically includes multi-level metallization and interconnect schemes.

Electrical interconnect techniques typically require electrical connection between metal or other conductive layers, or regions, which are present at different elevations within the substrate. Such interconnecting is typically conducted, in part, by etching a contact opening through insulating material to the lower elevation of a layer or conductive region. The significant increase in density of memory cells and vertical integration places very stringent requirements for contact fabrication technology. The increase in circuit density has resulted in narrower and deeper electrical contact openings between layers within the substrate, something commonly referred to as increasing aspect ratios. Such currently range from 1.5 to 5 and are expected to increase. Adequate contact coverage of electrically conductive materials ultimately placed within these deep and narrow contacts continues to challenge the designer in assuring adequate electrical connection between different elevation areas within the substrate.

The problem is exemplified in FIGS. 1 and 2. FIG. 1 illustrates a semiconductor wafer fragment 10 comprised of a bulk substrate 12 and an overlying silicon dioxide layer 14, such as borophosphosilicate glass (BPSG). Bulk substrate 12 includes a dopant diffusion/active region 16 to which electrical connection is to be made. A contact opening 18 is provided through BPSG layer 14 to active area 16.

A thin layer 20 of titanium and/or TiN is deposited atop the wafer to within contact opening 18. Layer 20 typically is provided to function as a silicide formation layer at the base of contact 18 for reducing resistance. An undesired oxide layer (not shown) also typically forms atop diffusion region 16. The deposited elemental type titanium also functions to break-up this undesired oxide. Thereafter, it forms a titanium silicide with the silicon of substrate 12 to reduce contact resistance between active area 16 and a subsequently deposited plug-filling tungsten. Additionally, titanium layer 20 functions as an adhesion/nucleation layer for subsequently deposited tungsten. Tungsten does not readily deposit over silicon dioxide and exposed silicon substrate, and the intervening titanium layer 20 facilitates deposition and adhesion of tungsten thereto.

Titanium layer 20 is typically deposited by sputter deposition, and undesirably results in formation of contact projecting cusps 22. This results in a back or re-entrant angle 24 being formed relative to contact opening 18. A layer 26 of tungsten is subsequently deposited, with the intent being to completely fill the remaining volume of contact opening 18. Unfortunately, an undesired keyhole 28 typically forms, leaving a void within contact 18.

FIG. 2 illustrates an alternate prior art embodiment wafer fragment 10a illustrating a modified contact opening 18a in a BPSG layer 14a which exacerbates the above keyhole problem. Many conventional dry etching techniques can have a tendency to produce the illustrated convex curved contact sidewalls which can further widen the keyhole void or form other voids within the contact opening, all of which is undesired.

It would be desirable to develop methods which alleviate the above described problems in formation of undesired voids in contact openings during filling of such openings with electrically conductive plugging material.

BRIEF DESCRIPTION OF THE DRAWINGS

Preferred embodiments of the invention are described below with reference to the following accompanying drawings.

FIG. 5 is a view of the FIG. 3 wafer fragment at a processing step subsequent to that shown by FIG. 4.

FIG. 6 is a view of the FIG. 3 wafer fragment at a processing step subsequent to that shown by FIG. 5.

DETAILED DESCRIPTION OF THE PREFERRED EMBODIMENTS

Figure 1:
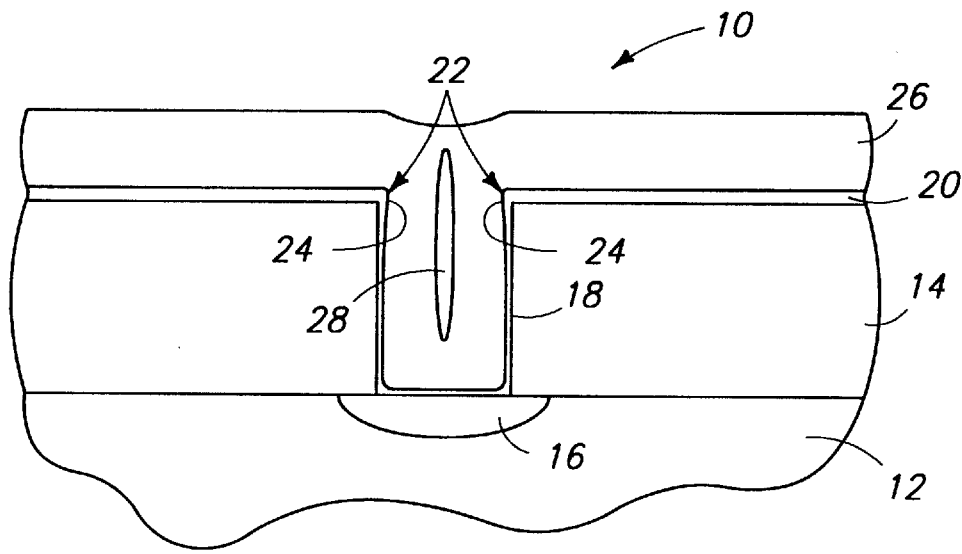
FIG. 1 is a diagrammatic sectional view of a prior art semiconductor wafer fragment and is discussed in the "Background" section above.
Figure 2:
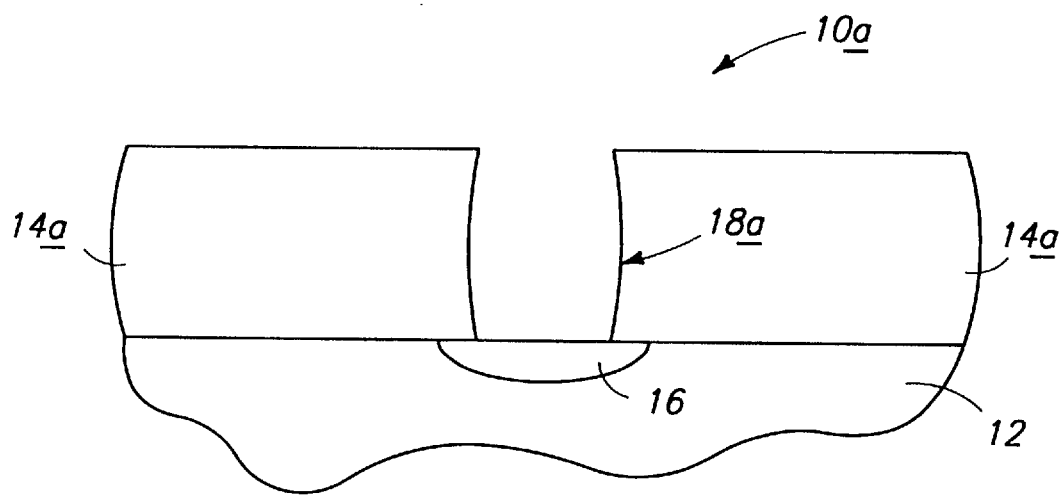
FIG. 2 is a diagrammatic sectional view of another prior art semiconductor wafer fragment discussed in the "Background" section above.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an insulating dielectric layer and a contact opening therein comprises the following steps:

forming an insulating dielectric layer over a substrate, the insulating layer having an outer portion and an inner portion, the outer portion being different from the inner portion, the difference at least being characterized by a higher etch rate for the outer portion than for the inner portion for a selected etch chemistry; and etching the insulating dielectric layer to produce a common contact opening into the outer and inner portions using the selected etch chemistry, the contact opening being wider in the outer portion than in the inner portion.

In accordance with another aspect of the invention, a semiconductor processing method of forming an insulating dielectric layer and a contact opening therethrough comprises the following steps:

providing a substrate having a node location to which electrical connection is to be made;

forming an insulating dielectric layer over the substrate and node location, the insulating layer having an outer portion and an inner portion, the outer portion being different from the inner portion, the difference at least being characterized by a higher etch rate for the outer portion than for the inner portion for a selected etch chemistry;

first etching a common contact opening into the outer and inner portions over the node location, the contact opening having substantially the same open width in the outer portion as in the inner portion; and after the first etching, second etching the common contact opening relative to the outer and inner portions using the selected etch chemistry, the contact opening having a wider open width in the outer portion than in the inner portion after the second etching.

In accordance with still a further aspect of the invention, a semiconductor processing method of forming an insulating dielectric layer and a contact opening therethrough comprises the following steps:

providing a substrate having a node location to which electrical connection is to be made;

forming a first insulating dielectric layer over the substrate and node location;

forming a second insulating dielectric layer over the first insulating layer, the second insulating layer having an outer portion and an inner portion, the outer portion being different from the inner portion, the difference at least being characterized by a higher etch rate for the outer portion than for the inner portion for a selected etch chemistry; and etching a common contact opening into the outer and inner portions of the second insulating layer and into the first insulating layer to the node location, the contact opening being wider in the outer portion than in the inner portion and in the first insulating layer.

Figure 3:
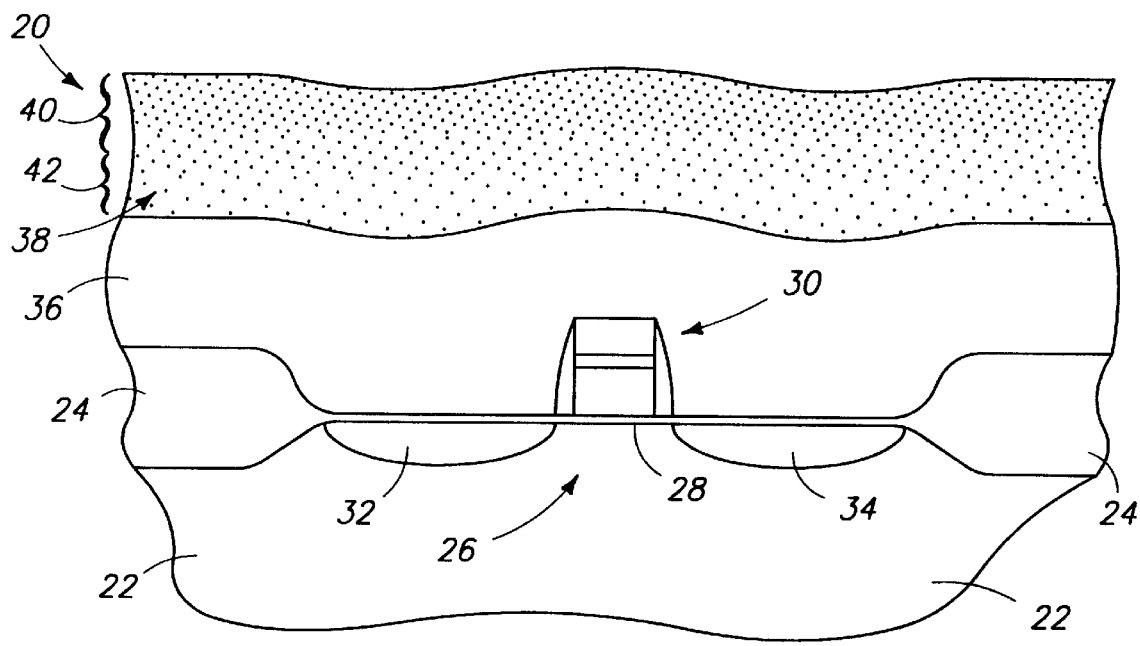
FIG. 3 is a diagrammatic sectional view of a semiconductor wafer fragment at one processing step in accordance with the invention.

A preferred semiconductor processing method of forming an insulating dielectric layer and a contact opening therein is initially described with reference to FIGS. 3–6. FIG. 3 illustrates a substrate 20 comprised of a bulk monocrystalline silicon substrate 22, a pair of field oxide regions 24, and intervening active area 26 provided between field oxide regions 24. A gate dielectric layer 28 spans between field oxide regions 24, and a gate construction 30 is shown received centrally relative to field oxide regions 24. Gate construction 30 comprises a conductive polysilicon region, an overlying higher electrically conductive silicide region, and an overlying electrically insulative cap and sidewall spacers. Source/drain regions 32 and 34 are provided laterally outward adjacent gate composite 30, and in the described preferred embodiment constitute respective node locations to which electrical connection is desired to be made.

A first insulating dielectric layer 36 is provided over the underlying substrate and node locations 32 and 34. An example and preferred material is doped silicon dioxide, such as borophosphosilicate glass (BPSG). Deposited layer 36 at this point in the process can either be left conformal as-deposited, completely planarized, or partially planarized (i.e., by reflow) as shown.

A second insulating layer 38 is provided over first insulating layer 36. Second insulating layer 38 comprises some outer portion 40 and some inner portion 42. Outer portion 40 is different from inner portion 42, with the difference at least being characterized by a higher etch rate for outer portion 40 than for inner portion 42 for some selected etch chemistry.

In the preferred embodiment, second insulating layer 38 comprises a substantially singular, in situ deposited layer having the different etch characteristics the result of varying precursor flow during its deposition. In an effort to clearly depict the differing etch rates, layer 38 is shown as being "peppered" with dots having a graded and greater density in moving outwardly from inner portion 42 to outer portion 40, the result of a variation of certain precursor gases during layer 38 deposition.

A preferred material for layer 38 is $SiO_2$ deposited by decomposition of tetraethylorthosilicate (TEOS). It has been discovered that the wet etch rate of a resultant $SiO_2$ layer can be affected by varying flow of precursor gases throughout deposition in a manner whereby the outer portion of a deposited layer can result in a different wet etch rate than the inner portion of such layer. In the preferred example, such can be controlled by varying respective flow rates of $O_2$, $O_3$ and TEOS during a plasma enhanced chemical vapor deposition process for producing $SiO_2$ layer 38.

Specifically, higher wet etch rate in a hydrofluoric acid solution occurs where the $SiO_2$ layer results from $O_3$ fed into the chamber along with TEOS as compared to when $O_2$ is used with TEOS. Accordingly in the preferred embodiment, the step of providing second insulating layer 38 comprises flowing respective volumes of $O_2$ and $O_3$ with TEOS. The flow rate of $O_3$ compared to the flow rate of $O_2$ into the chamber is controlled to be greater towards the end of the deposition than at the beginning to provide outer portion 40 to comprise $SiO_2$ having a higher etch rate than inner portion 42. Such might be accomplished by initially feeding $O_2$ and no $O_3$ with the TEOS flow, and at some point changing the flow to no $O_2$ and all $O_3$ with TEOS. Alternately, some portions of $O_2$ and $O_3$ can be fed along with TEOS throughout the deposition, with the flow rates being varied such that the $O_3$ quantity increases to some higher value towards the conclusion of the deposition.

For example, consider a $SiO_2$ layer deposited by plasma enhanced chemical vapor deposition at an RF power of 630 # W, pressure of 8 # Torr, wafer platen temperature of 400° C., carrier gas flow of 840 sccm of for example He or Ar through the TEOS, and a pure $O_2$ flow of either 600 sccm or 1200 sccm. Assume a selected wet etch chemistry of a hydrofluoric solution having 100 volume parts water to 1 volume part HF, and etching at atmospheric pressure and 20° C.–25° C. The $SiO_2$ layer deposited at 600 sccm will have an etch rate in such chemistry of about 80 Angstroms/minute, whereas a $SiO_2$ layer deposited using a 1200 sccm of pure $O_2$ flow will etch at about 60 Angstroms/minute. Accordingly, higher purity $O_2$ flows lead to more stoichiometric oxides, with lower etch rates for such chemistry.

The etch rate can be altered significantly by incorporating $O_3$ flow during deposition. For example, consider a plasma enhanced chemical vapor deposition under conditions of 1200 sccm of inert helium or argon through TEOS, RF power of 630 # W, pressure of 60 # Torr, platen temperature of 400° C., and flow of an $O_2$ and $O_3$ mixture at a total flow of either 2400 sccm or 1600 sccm. Also by way of example, a 50/50 percent by volume mix of oxygen and ozone in the respective 2400 sccm and 1600 sccm flows can be assumed. The silicon dioxide deposited at the 2400 sccm flow will have an etch rate in the same above chemistry at about 520 Angstroms/minute, whereas the silicon dioxide deposited at the 1600 sccm flow rate will have an etch rate of 630 Angstroms/minute.

As can be seen with the above examples, the etch rate for such chemistry can therefore be varied from around 60 Angstroms/minute to over 600 Angstroms/minute, a factor of greater than about 10. Accordingly, layer 38 is preferably deposited in such a manner that oxygen or ozone flow rate is continuously varied throughout deposition such that a substantially unitary or single layer 38 results. Such is controlled to produce different etch characteristics in the outer portion versus the inner portion, with the outer portion etch rate being greater than the inner portion. Alternate graded dielectric films could also be deposited in a graded fashion with variation in etch rates and precursor feeds in accordance with this particular preferred embodiment.

Figure 4:
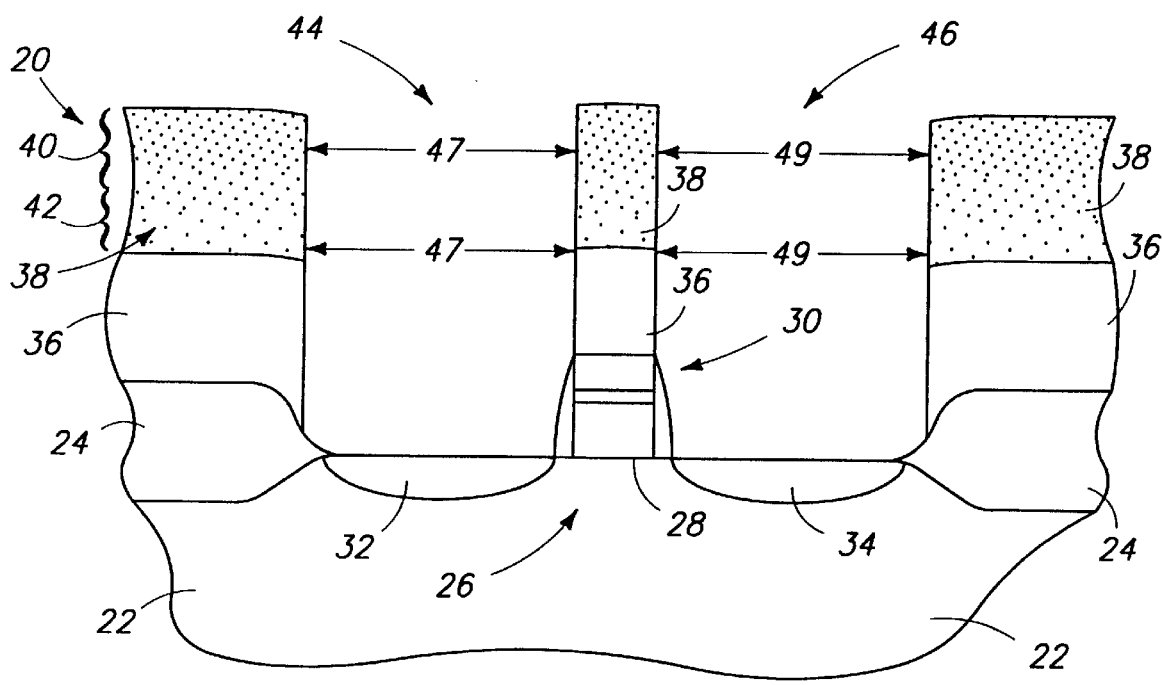
FIG. 4 is a view of the FIG. 3 wafer fragment at a processing step subsequent to that shown by FIG. 3.

Referring to FIG. 4, a photoresist layer would be deposited (not shown) and patterned, and a first etching conducted to produce the illustrated respective common contact openings 44 and 46 into outer portion 40 and inner portion 42 of first insulating layer 38 over respective node locations 32 and 34, and into first insulating layer 36. In the preferred embodiment, contact openings 44 and 46 as initially etched will have their respective same open widths 47 and 49, respectively, in outer portion 40 of insulating dielectric layer 38 as in inner portion 42 of insulating dielectric layer 38. Further, such first etching is preferably conducted completely to outwardly expose the respective node locations 32 and 34, as shown. An example preferred first etching would utilize a highly anisotropic dry etch chemistry, such as $CHF_3$, $CH_4$ and Ar at 700 Watts, 50 mTorr and 50° C.

Referring to FIG. 5 and after the first etching, layers 38 and 36 are second etched using the selected chemistry to produce modified respective common contact openings 44a and 46a, with such having respective wider open widths 47a and 49a in outer portion 40 than in inner portion 42 after such second etching. The higher etch rate of the outer layer utilizing the above example chemistry, which is also higher in degree of isotropy in the etch, effectively produces the widened outer contact openings. Preferably, the etch chemistry is chosen such that no substantial lateral or isotropic etching occurs relative to that portion of contact openings 44 and 46 passing through first insulating layer 36. Even if the dry or other etching utilized to initially produce contact openings 44 and 46 produces an undesired degree of convex opening sidewalls, the above described preferred embodiment wherein at least at some point in the etch etching is conducted to produce a wider opening, the convex nature of such sidewalls can be effectively overcome.

Referring to FIG. 6, contact openings 44a and 46a are ultimately filled or plugged with electrically conductive material 51. Such could be provided by sputter deposition or other deposition technique. A nucleation/adhesion or barrier layer (not shown), like layer 20 in FIG. 1, would also typically be provided. Subsequently, the conductive material is preferably planarized back as shown.

Figure 7:
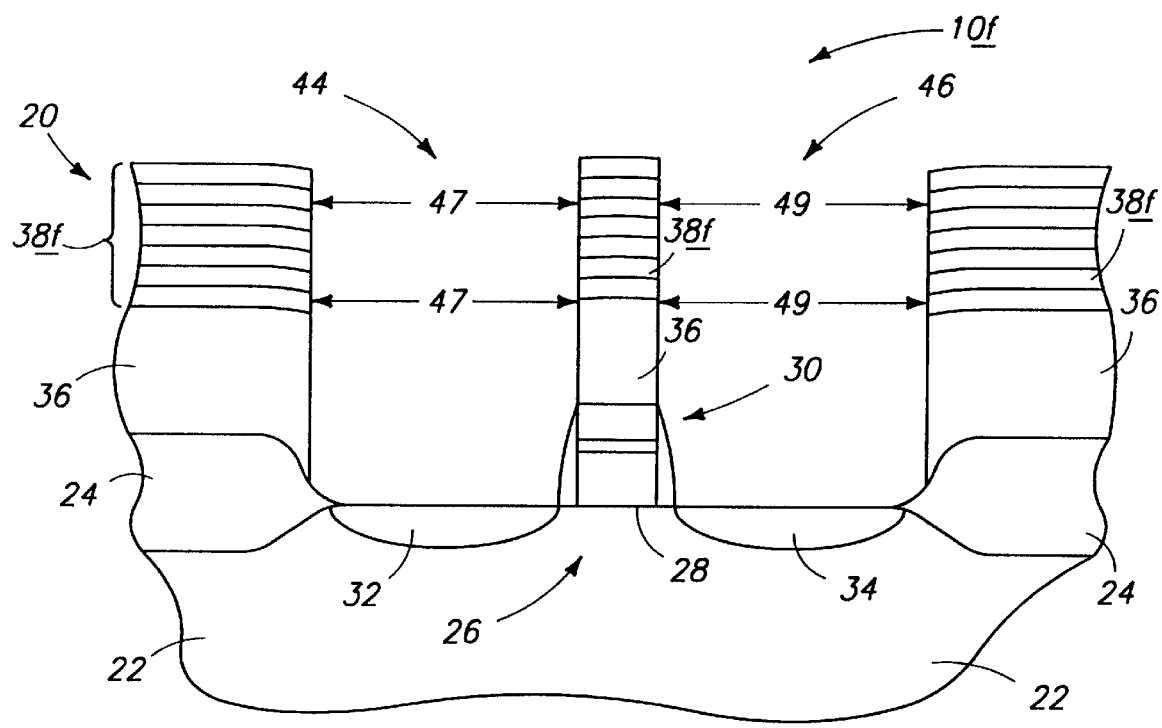
FIG. 7 is a diagrammatic sectional view of an alternate embodiment semiconductor wafer fragment at one processing step in accordance with the invention.
Figure 8:
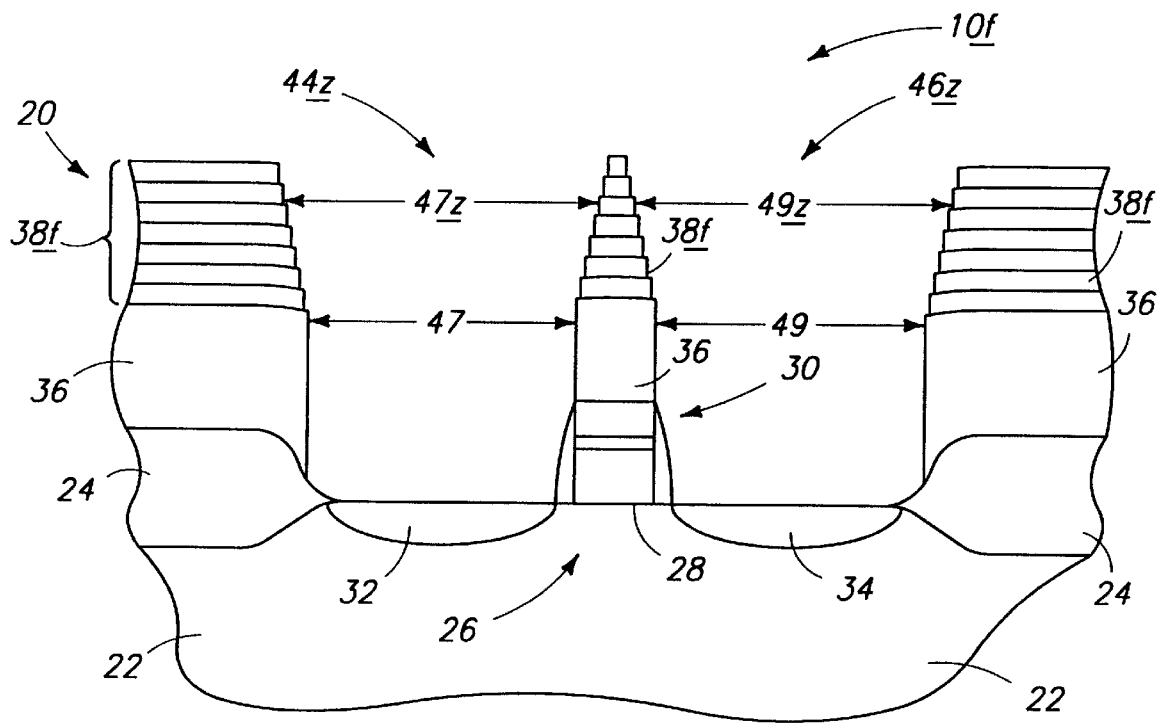
FIG. 8 is a view of the FIG. 7 wafer fragment at a processing step subsequent to that shown by FIG. 7.

An alternate embodiment is described with reference to FIGS. 7 and 8. Like numerals from the first described embodiment are utilized where appropriate, with differences being indicated by the suffix "f", or with different numerals. Here, second electrically insulating layer 38f is shown to comprise a composite of a plurality of several discrete layers, as opposed to the preferred embodiment substantially singular layer 38 described above. FIG. 8 illustrates possible sequential subsequent second etching which produces a more step or stair-like profile for respective resultant contact openings 44z and 46z.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a contact opening comprising the following steps:

providing a substrate having a node location to which electrical connection is to be made;

forming a layer comprising doped silicon dioxide over the node location;

after forming the layer comprising doped silicon dioxide, flowing both $O_2$ and $O_3$ simultaneously to the substrate along with tetraethylorthosilicate to the substrate to form a continuous layer comprising undoped silicon dioxide on the layer comprising doped silicon dioxide, and during the flowing increasing a ratio of $O_3$ to $O_2$ flows to form an outer portion of the continuous layer comprising undoped silicon dioxide to have a higher etch rate for a selected wet etch chemistry than an inner portion of said continuous layer;

first anisotropically dry etching a common contact opening into the layer comprising undoped silicon dioxide and into the layer comprising doped silicon dioxide over the node location to outwardly expose the node location; and after the first etching, second wet etching with the selected chemistry within the common contact opening to widen the contact opening in the outer portion of the layer comprising undoped silicon dioxide as compared to the inner portion of the layer comprising undoped silicon dioxide, the second wet etching being effectively selective to not substantially laterally etch the layer comprising doped silicon dioxide.

* * * * *

UNITED STATES PATENT AND TRADEMARK OFFICE
CERTIFICATE OF CORRECTION

PATENT NO.    : 5,849,635
DATED         : December 15, 1998
INVENTOR(S)   : Salman Akram et al.

It is certified that errors appear in the above-identified patent and that said Letters Patent is hereby corrected as shown below:

Column 4, lines 38 & 39, replace "630 # W," with --630W,--.

Column 4, line 39, replace "8 # Torr," with --8Torr,--.

Column 4, line 55, replace "630 # W," with --630W,--.

Column 4, line 55, replace "60 # Torr," with --60Torr,--.

Signed and Sealed this

Eighth Day of June, 1999

Attest:

Q. TODD DICKINSON

Attesting Officer    Acting Commissioner of Patents and Trademarks